US006443745B1

(12) United States Patent
Ellis et al.

(10) Patent No.: US 6,443,745 B1
(45) Date of Patent: Sep. 3, 2002

(54) HIGH SPEED CONNECTOR

(75) Inventors: John R. Ellis, Harrisburg; Timothy A. Lemke, Dillsburg, both of PA (US)

(73) Assignee: FCI Americas Technology, Inc., Reno, NV (US)

(*) Notice: Subject to any disclaimer, the term of this patent is extended or adjusted under 35 U.S.C. 154(b) by 0 days.

(21) Appl. No.: 09/582,847

(22) PCT Filed: Jan. 8, 1999

(86) PCT No.: PCT/US99/00411

§ 371 (c)(1),
(2), (4) Date: Sep. 5, 2000

(87) PCT Pub. No.: WO99/00411

PCT Pub. Date: Jan. 9, 1998

Related U.S. Application Data

(60) Provisional application No. 60/070,820, filed on Jan. 8, 1998.

(51) Int. Cl.[7] ........................ H01R 13/648; H01R 4/66; H01R 12/00; H05K 1/00

(52) U.S. Cl. .......................... 439/101; 439/608; 439/83

(58) Field of Search ................................ 439/101, 108, 439/608, 83

(56) References Cited

U.S. PATENT DOCUMENTS

| | | | | |
|---|---|---|---|---|
| 3,474,383 A | | 10/1969 | Mahon et al. | 339/33 |
| 4,415,214 A | | 11/1983 | Obst | 339/91 |
| 4,740,180 A | | 4/1988 | Harwath et al. | 439/856 |
| 4,881,905 A | | 11/1989 | Demler, Jr. et al. | 439/79 |
| 5,094,623 A | * | 3/1992 | Scharf et al. | 439/101 |
| 5,174,770 A | * | 12/1992 | Sasaki et al. | 439/108 |
| 5,417,578 A | * | 5/1995 | Mroczkowski et al. | 439/101 |
| 5,741,144 A | * | 4/1998 | Elco et al. | 439/101 |
| 5,777,850 A | * | 7/1998 | Jakob et al. | 361/736 |
| 5,795,191 A | | 8/1998 | Preputnick et al. | 439/608 |
| 5,961,355 A | | 10/1999 | Morlion et al. | 439/686 |
| 5,967,832 A | | 10/1999 | Ploehn | 439/497 |
| 6,116,923 A | * | 9/2000 | Szu | 439/83 |
| 6,132,222 A | * | 10/2000 | Wang et al. | 439/70 |
| 6,139,336 A | * | 10/2000 | Olson | 439/83 |
| 6,171,149 B1 | * | 1/2001 | Van Zanten | 439/608 |
| 6,174,172 B1 | * | 1/2001 | Kazama | 439/66 |

FOREIGN PATENT DOCUMENTS

| | | |
|---|---|---|
| EP | 0 486 298 B1 | 1/1996 |
| EP | 0 881 718 A2 | 12/1998 |

* cited by examiner

*Primary Examiner*—P. Austin Bradley
*Assistant Examiner*—Edwin A. León
(74) *Attorney, Agent, or Firm*—Woodcock Washburn LLP

(57) ABSTRACT

An electrical connector having an insulating housing, a plurality of first contacts (139), a plurality of second contacts (141,143), wherein the connector exhibits a desired characteristic impedance. The second contacts are angled relative to the first contacts and each has an edge (151) disposed adjacent to an edge or side of first contacts. An electrical connector as described above where the first contacts are signal contacts, the second contacts are power or ground contacts, and the desired impedance is approximately less than 50 ohms.

30 Claims, 20 Drawing Sheets

HIGH SPEED CONNECTOR

This Application contain benefit of provisional application Ser. No. 60/070,820 filed Jan. 8, 1998.

BACKGROUND OF THE INVENTION

1. Field of the Invention

The present invention relates to an electrical connector. More specifically, the present invention relates to a high speed electrical connector.

2. Brief Description of Earlier Developments

Technological advances in computer processors and memory impact the interconnection systems that couple the processors or memory to other components. One such technological advance is the increased speed of computer systems. The interconnect system must precisely control the electrical characteristics in order to interact properly with the processors or memory of these high speed computer systems.

While precisely controlling the electrical characteristics of the connector for compatibility, the design of the connector must also consider mechanical requirements such as high pin count, high pin density, low insertion force and low profile. The design of the connector must also be compatible with the processes used in making electronic assemblies, such as surface mount technology (SMT). Also important, the interconnection system must be cost effective.

One affect of these technological advances involves the desired characteristic impedance of the interconnection system. Current technology generally demands that the interconnection system exhibit a technology generally demands that the interconnection system exhibit a characteristic impedance of approximately 50 ohms. Future requirements, however, may require certain interconnection systems to exhibit lower characteristic impedance values, such as approximately 25–30 ohms. The interconnection system must match the characteristic impedance of the entire system, or risk the integrity of the signals that pass through. Mismatch can cause reflections that degrade the sub-nanosecond edge rates of the signals.

One solution to lowering the characteristic impedance of the connector utilizes bent contacts. The bend creates different pitch values on the mounting side and mating side of the connector. On the mounting side, for example, the contacts could have a common pitch, such as 0.050' for attachment to a printed circuit board (PCB). On the mating side, the pitch could have a smaller value. While the smaller pitch value may decrease the characteristic impedance of the connector, this solution introduces other problems. In order to accommodate the bend, the contact must be longer. The longer contact could exhibit a greater inductance and could potentially create an impedance mismatch with other parts of the contact. The longer contact sacrifices the profile height of the connector. Finally, the bending process could potentially fracture the contact.

SUMMARY OF THE INVENTION

It is an object of the present invention to provide an improved electrical connector.

It is a further object of the present invention to provide an electrical connector compatible with future electronic systems.

It is a further object of the present invention to provide a tunable electrical connector.

It is a further object of the present invention to provide a controlled impedance electrical connector.

It is a further object of the present invention to provide an electrical connector with a low characteristic impedance.

It is a further object of the present invention to provide a high speed electrical connector that maintains a common contact pitch.

It is a further object of the present invention to provide a surface mounted, high speed electrical connector.

It is a further object of the present invention to provide a high pin count, high speed electrical connector.

It is a further object of the present invention to provide a high contact density, high speed electrical connector.

It is a further object of the present invention to provide a low profile, high speed electrical connector.

It is a further object of the present invention to provide a cost effective high speed electrical connector.

These and other objects are achieved, in one aspect of the present invention, by an electrical connector having an insulative housing, a plurality of signal contacts, and a plurality of ground or power contacts, wherein the connector exhibits a characteristic impedance of less than approximately 50 ohms.

These and other objects are achieved, in another aspect of the present invention, by an electrical connector, comprising: an insulative housing; a plurality of first contacts; and a plurality of second contacts angled relative to the first contacts.

These and other objects are achieved in another aspect of the present invention by an electrical connector, comprising: an insulative housing; a plurality of first contacts; a plurality of second contacts, each having an edge disposed adjacent an edge or side of one of the first contacts.

These and other objects are achieved in another aspect of the present invention by a method of making an electrical connector. The method includes the steps of: providing an insulative housing; providing a plurality of signal contacts; providing a plurality of ground or power contacts; inserting the signal contacts into the insulative housing; inserting the ground or power contacts into the insulative housing so that an edge of each ground or power contact is positioned adjacent one of the signal contacts. The electrical connector exhibits a desired characteristic impedance.

BRIEF DESCRIPTION OF THE DRAWINGS

Other uses and advantages of the present invention will become apparent to those skilled in the art upon reference to the specification and the drawings, in which.

DETAILED DESCRIPTION OF THE PREFERRED EMBODIMENTS

The present invention generally relates to an electrical connector having an insulative housing and a plurality of contacts arranged thereon. To operate at high speeds, such as greater than 500 MHz, the signal contacts are surrounded by ground or power contacts. Each alternative embodiment of the present invention has a different arrangement of the contacts in order to achieve certain objectives.

The first alternative embodiment of the present invention will now be described with reference to FIGS. 1–4, 5*a*, 5*b* and 16*a*. The connector includes a receptacle 101 and a plug 103. A discussion of receptacle 101 and plug 103 follows.

Figure 1:
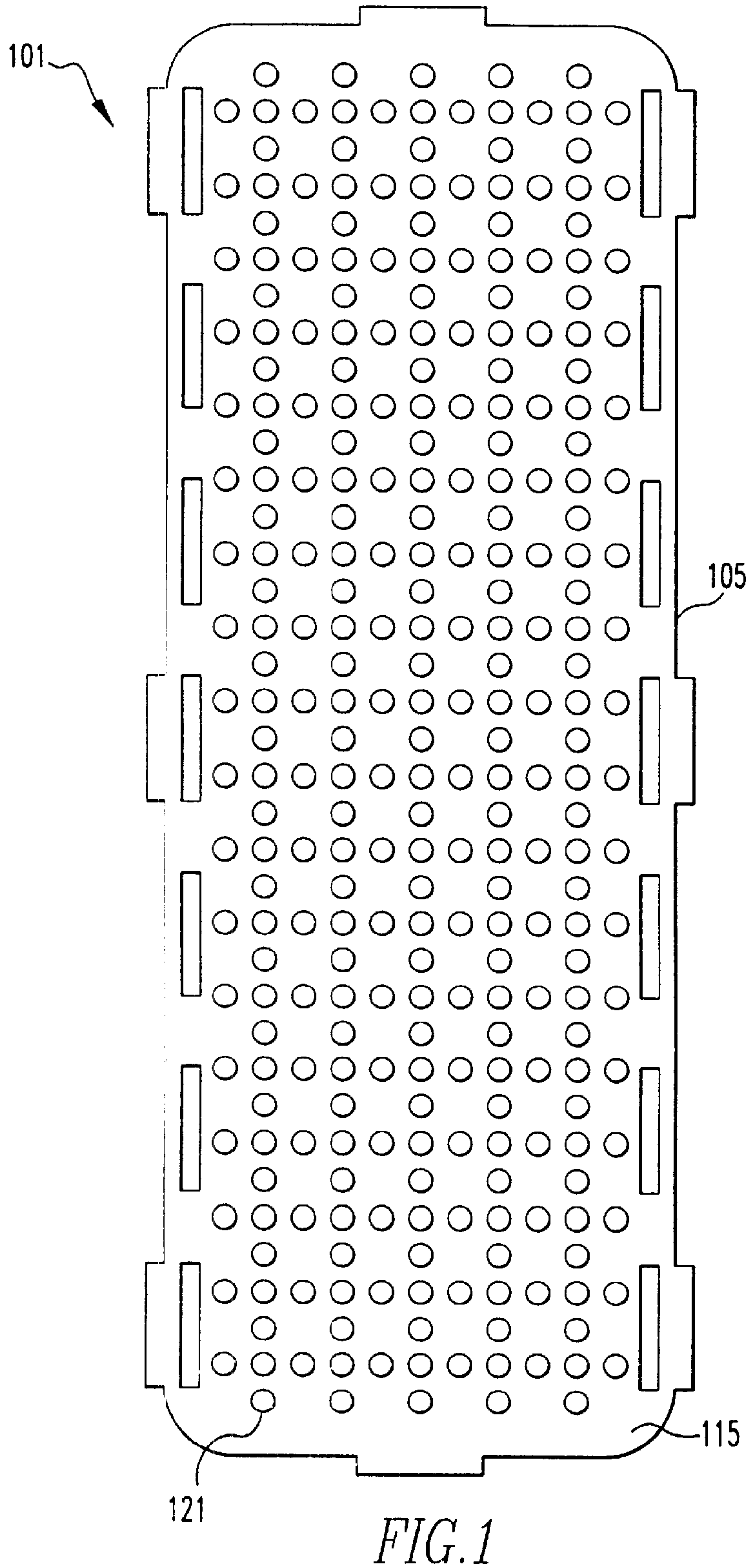
FIG. 1 is a bottom view of one component of a first alternative embodiment of the present invention.
Figure 2:
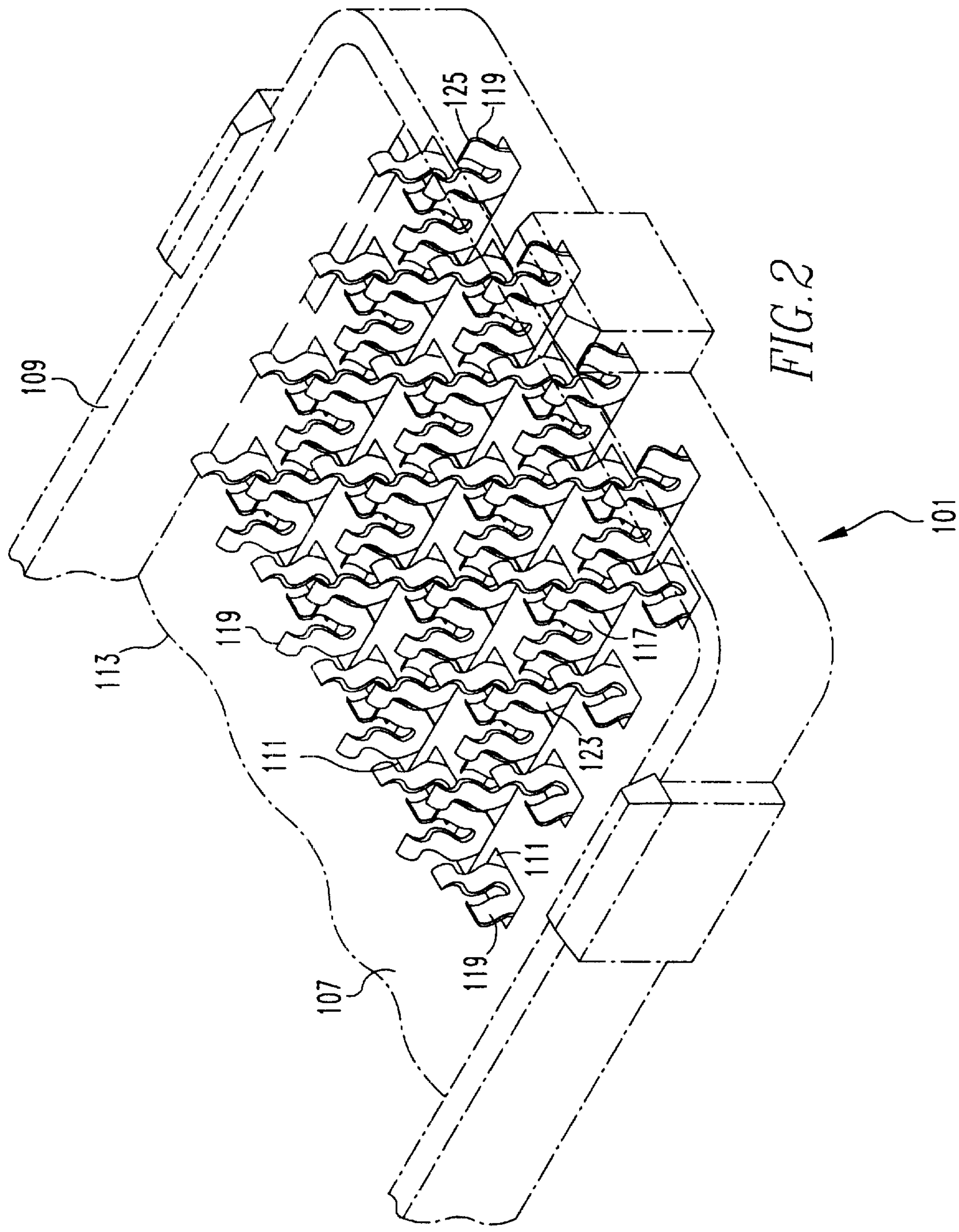
FIG. 2 is a perspective view of the component shown in FIG. 1.
Figure 3:
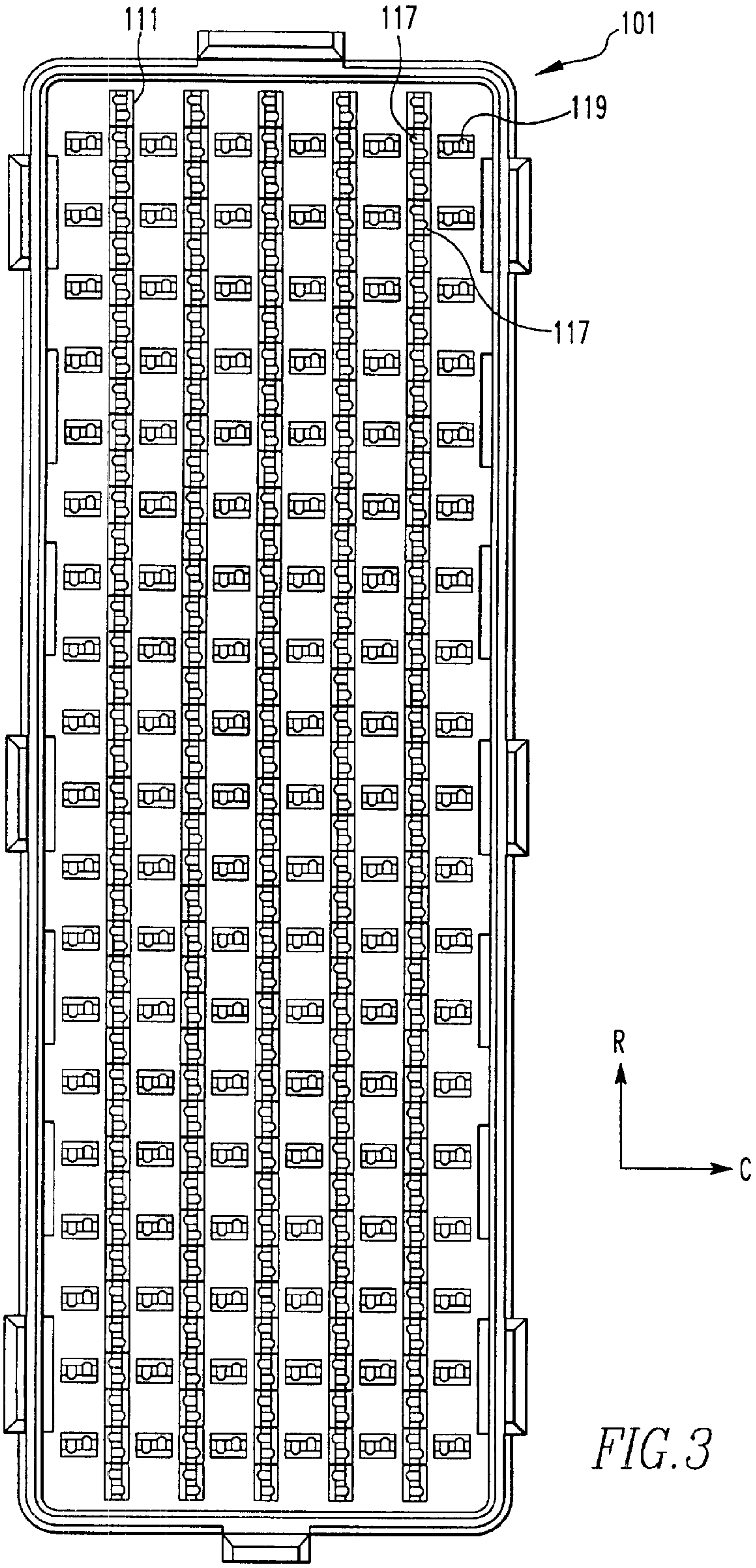
FIG. 3 is a top view of the component shown in FIG. 1.

With reference to FIGS. 1–3, receptacle 101 has an insulative housing 105 made from a suitable plastic, such as liquid crystal polymer 20 (LCP). Housing 105 can have a generally planar base 107 with a wall 109 extending around the perimeter.

Apertures 111 extend through housing 105 from a mating end 113 that faces plug 103 to a mounting end 115 that faces a substrate (not shown) to which receptacle 101 attaches. Contacts 117, 119 reside within apertures 111, preferably by an interference fit. Contacts 117, 119 form an array of rows and columns on housing 105. Rows align with arrow R in the figures and columns align with arrow C in the figures. Although FIGS. 2 and 3 display dual beam contacts 117, 119, receptacle 101 could use other types of contacts.

Preferably, the end of contacts 117, 119 adjacent mounting end 115 has a fusible element, such as a solder ball 121, secured thereto for surface mounting the connector to the substrate. International Publication number WO 98/15989 (International Application number PCT/US97/18066), herein incorporated by reference, describes methods of securing a solder ball to a contact and of securing a connector having solder balls to a substrate. Contacts 117, 119 could, however, secure to the substrate using other techniques.

Contact 117 preferably carries a signal, while contacts 119 carry ground or power. For high speed operations, four contacts 119 surround each contact 117 as shown in FIG. 2. Two of the four contacts 119 reside in the same row as contact 117, while the other two of the four contacts 119 reside in adjacent rows.

Contacts 119 that reside in the same row as contact 117 have generally the same orientation as contact 117. Contacts 119 that reside in adjacent rows are angled relative to contact 117. Preferably, contacts 119 that reside in adjacent rows are generally perpendicular to contact 117.

Each contact 117, 119 has major surfaces defining sides 123 and minor surfaces defining edges 125. As shown in FIGS. 2 and 3, an edge 125 of each contact 119 is adjacent contact 117. Placing edge 125 of contact 119 nearest contact 117 more strongly couples contacts 117, 119 than when side 123 of contact 119 is placed adjacent contact 117.

Figure 4:
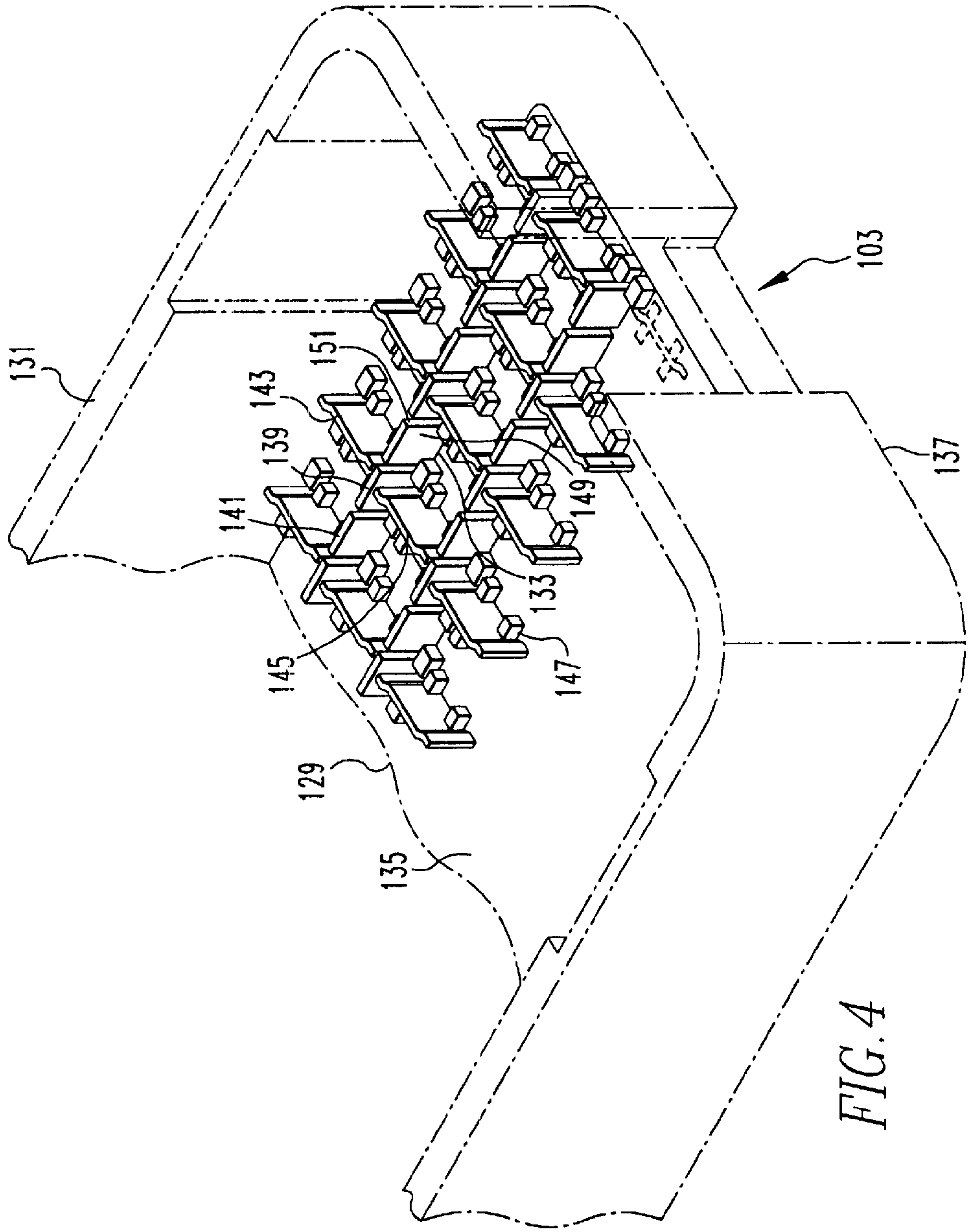
FIG. 4 is a perspective view of another component of the first alternative embodiment of the present invention.
Figure 5A:
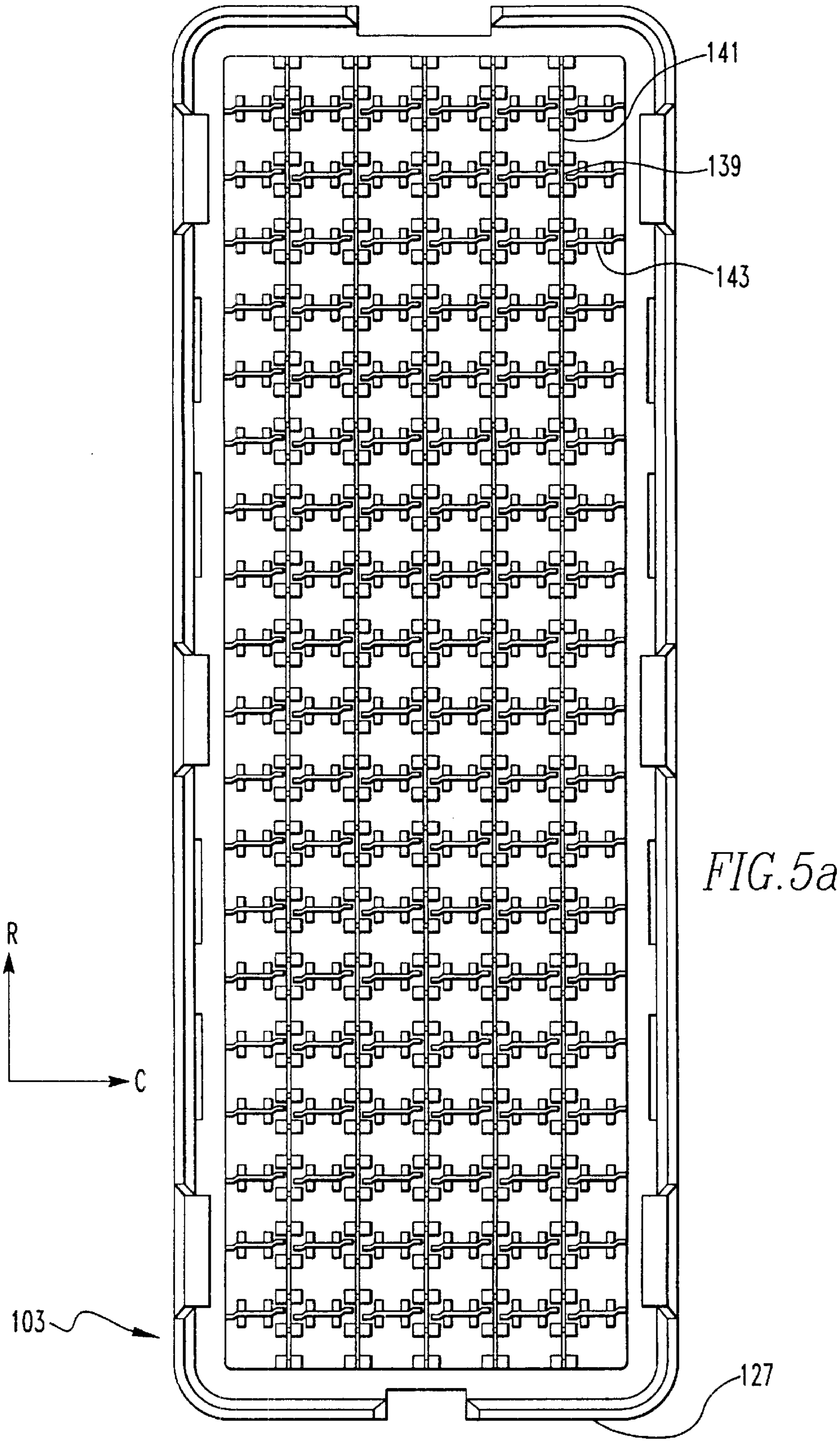
FIG. 5*a* is a top view of the component shown in FIG. 4.

With reference to FIGS. 4 and 5*a*, plug 103 has an insulative housing 127 made from a suitable plastic, such as liquid crystal polymer (LCP). Housing 127 can have a generally planar base 129 with a wall 131 extending around the perimeter.

Apertures 133 extend through housing 127 from a mating end 135 that faces receptacle 101 to a mounting end 137 that faces a substrate (not shown) to which plug 103 attaches. Contacts 139, 141, 143 reside within apertures 133, preferably by an interference fit. Contacts 139, 141, 143 form an array of rows (aligned with arrow R) and columns (aligned with arrow C) on housing 127.

Due to the close proximity of contacts 143 to contacts 139, contacts 143 can have bent portions 145 to avoid interference with the beams of contacts 117 as they engage contacts 139 during mating. Although FIGS. 3 and 4 display blade-type contacts, plug 103 could use other types of contacts.

A series of projections 147 can extend from mating end 135 of housing 127. Projections 147 are preferably formed during the injection molding step that forms housing 127. In the embodiment shown in FIG. 5*a*, projections 147 abut sides 123 of contacts 139, 141, 143. Projections 147 can serve, for example, two purposes. First, projections 147 can help control the coupling between contacts 139 and contacts 141, 143. Second, projections 147 can laterally support contacts 139, 141, 143 to improve rigidity.

Figure 5B:
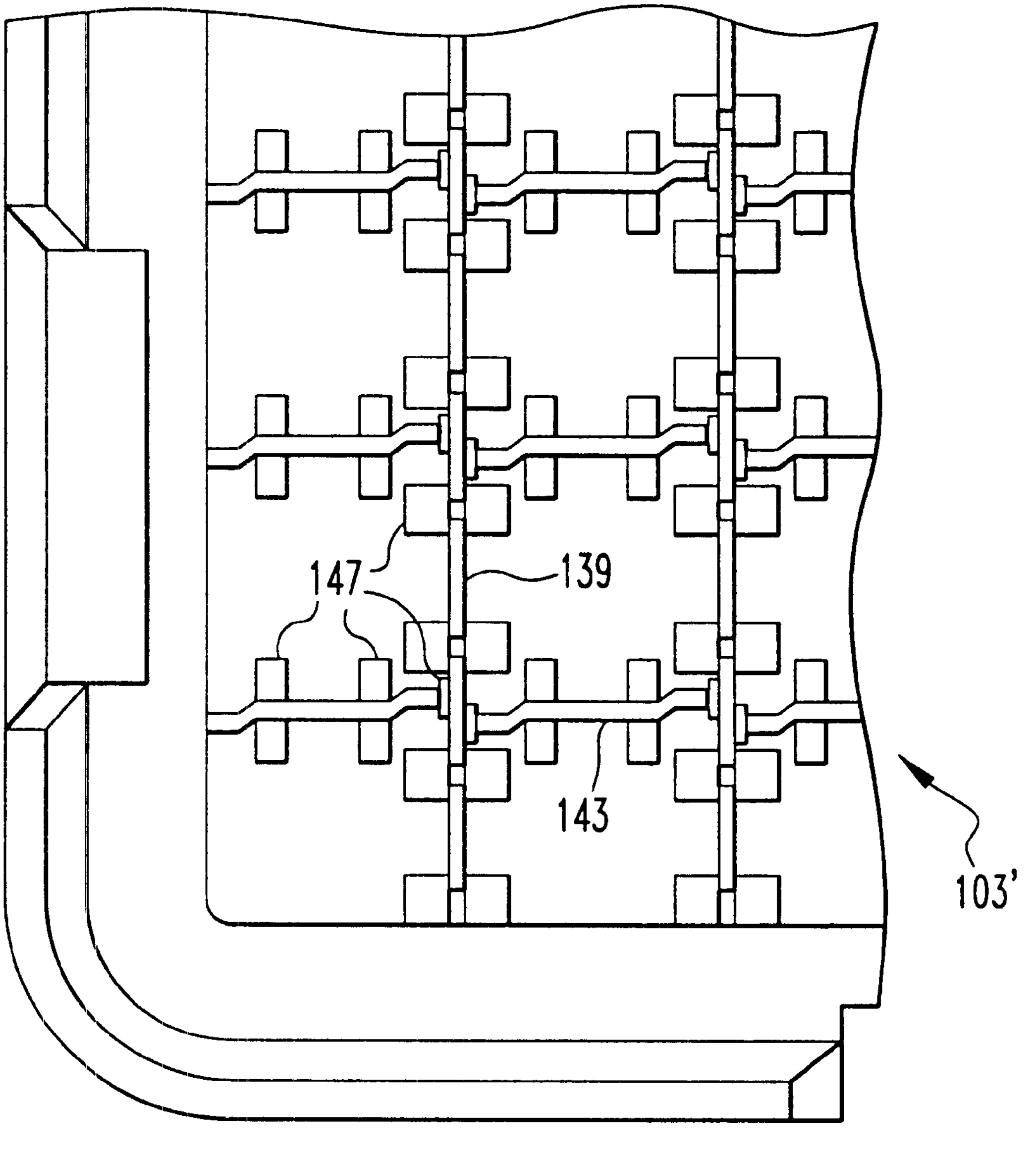
FIG. 5*b* is a top view of an alternative arrangement of the component 25 shown in FIG. 4.

In the alternative embodiment shown in FIG. 5*b*, projections 147 can also reside in the area between contacts 139, 143. The placement of a material between a ground and a signal contact controls characteristic impedance. Selecting a specific material, including air, helps tune characteristic impedance of the connector as a result of the dielectric constant of the material.

As with receptacle 101, the end of contacts 139, 141, 143 adjacent mounting end 137 has a fusible element, such as a solder ball (not shown), secured thereto for surface mounting the connector to the substrate using, for example, ball grid array (BGA) technology. Contacts 139, 141, 143 could, however, secure to the substrate using other techniques.

Contact 139 preferably carries a signal, while contacts 141, 143 carry ground or power. For high speed operations, four contacts 141, 143 surround each contact 139 as shown in FIG. 4. Contacts 141 reside in the same row as contact 139, while contacts 143 reside in adjacent rows.

Contacts 141 have generally the same orientation as contact 139 since they reside in the same row. Contacts 143, however, are angled relative to contacts 139. Preferably, contacts 143 are generally perpendicular to contacts 139.

Each contact 139, 141, 143 has major surfaces defining sides 149 and minor surfaces defining edges 151. As shown in FIGS. 3 and 4, an edge 151 of each contact 141, 143 is adjacent contact 139. Placing edges 151 of contacts 141, 143 nearest contact 139 more strongly couples contacts 139 with contacts 141, 143 than when sides 149 of contacts 141, 143 are 20 placed adjacent contact 139.

Figure 16A:
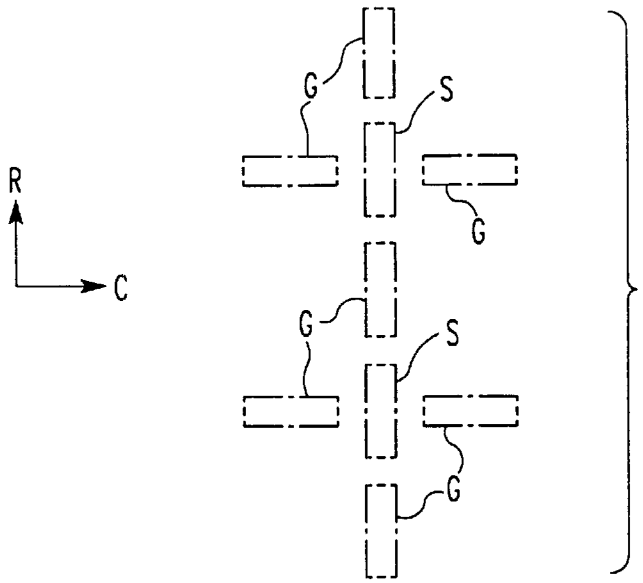
FIGS. 16*a–c* are schematics of the contact arrangement in the first alternative embodiment of the present invention; the second and a portion of the fourth alternative embodiment of the present invention; and the third alternative embodiment of the present invention, respectively.

FIG. 16*a* schematically demonstrates the contact arrangement in the first alternative embodiment of the present invention. As discussed above, four ground or power contacts G surround each signal contact S. Except for the ground or power contacts G around the exterior of the connector, each ground or power contact G provides shielding to more than one signal contact S. The use of ground or power contacts G to shield more than one signal contact S provides the first alternative embodiment of the present invention with the highest ratio of signal contacts to ground or power contacts. As an example, a 13×13 array connector with a total pin count of 114 could have 36 signal contacts and 78 ground or power contacts. The remaining alternative embodiments of the present invention described below have lower signal-to-ground ratios.

The second alternative embodiment of the present invention will now be described with reference to FIGS. 6–9 and 16*b*. Features common to the other alternative embodiments will use the same reference character, save a change in the hundred digit.

Figure 6:
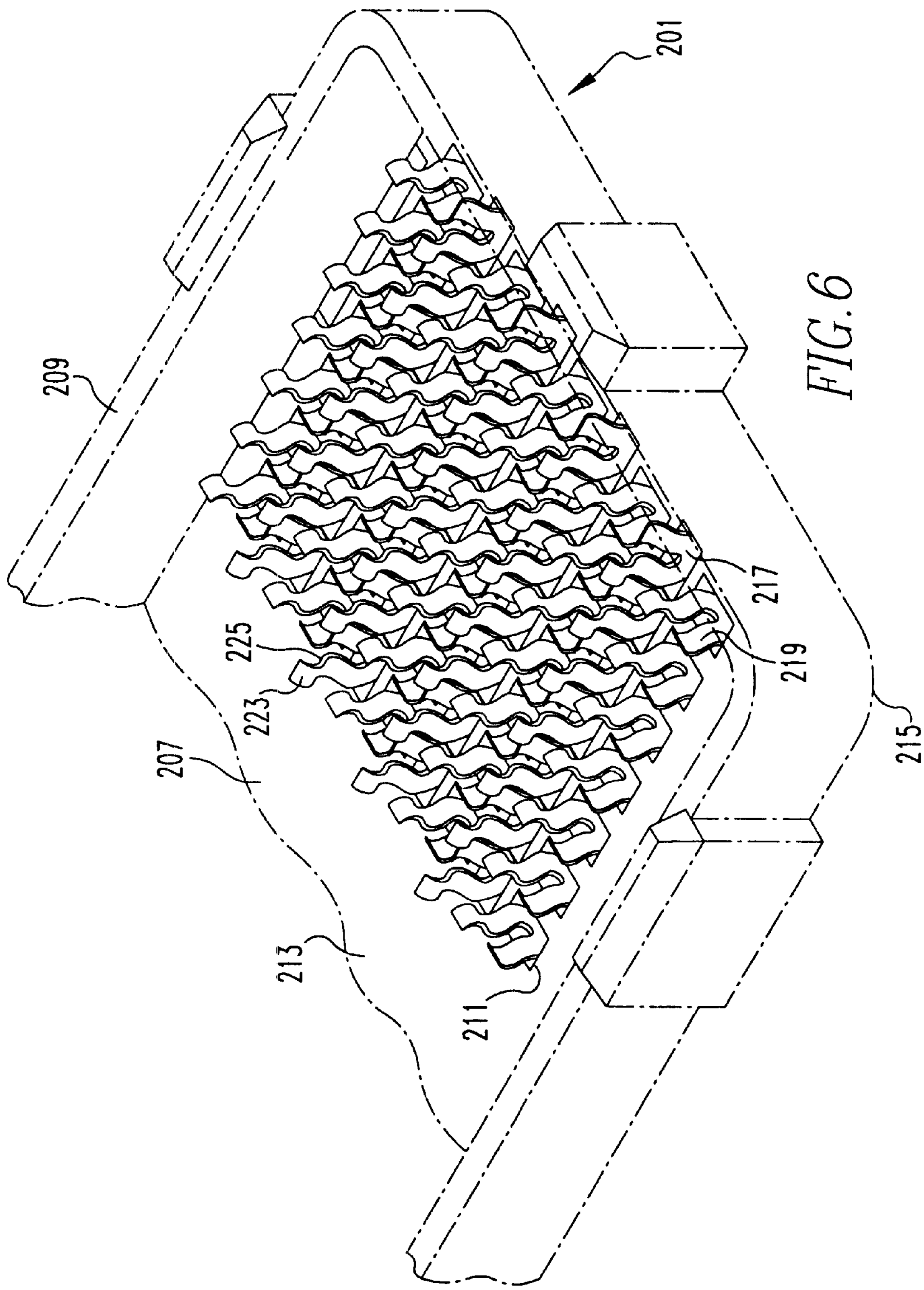
FIG. 6 is a perspective view of one component of a second alternative embodiment of the present invention.
Figure 7:
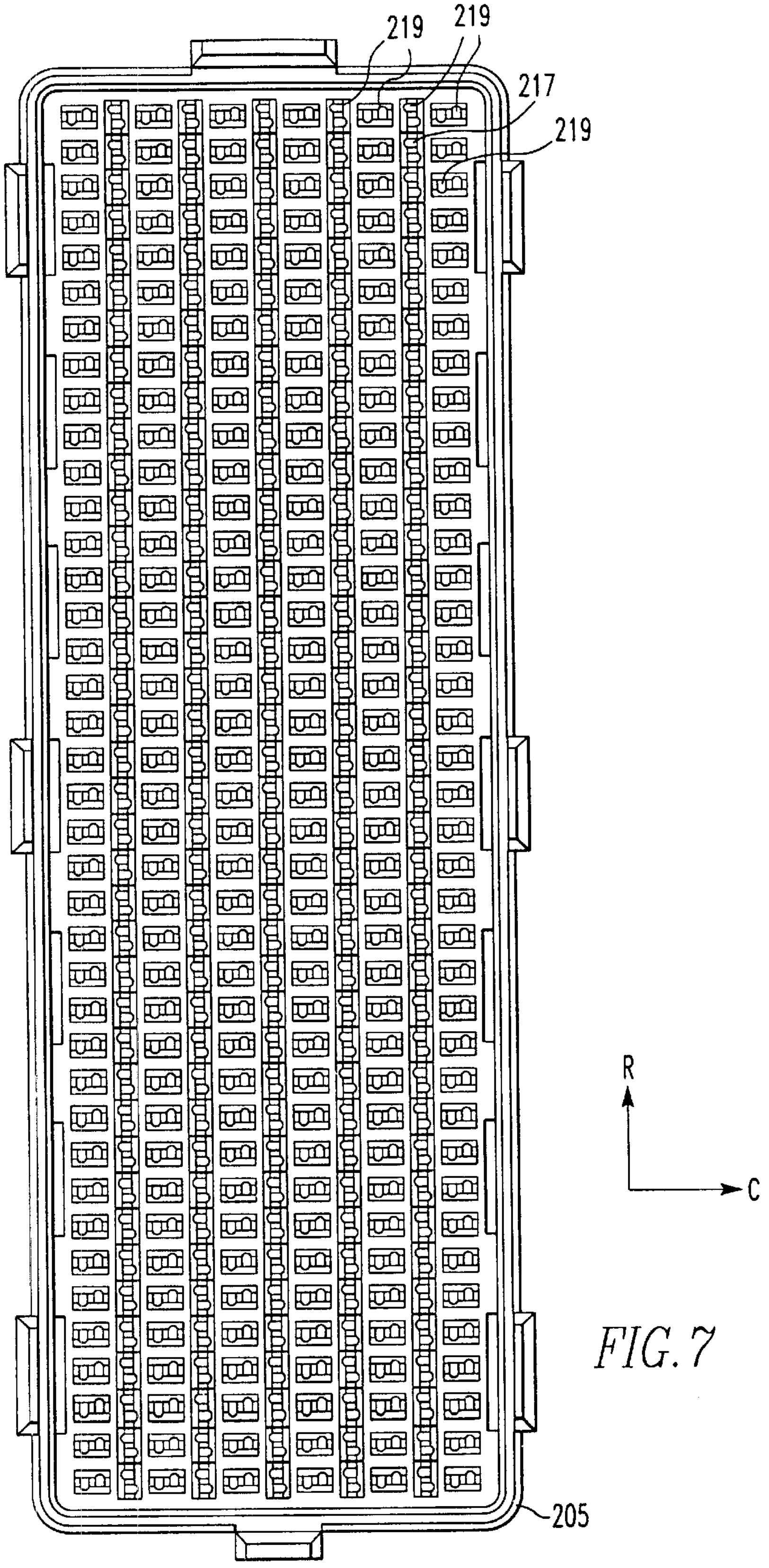
FIG. 7 is a top view of the component shown in FIG. 6.

The connector includes a receptacle 201 and a plug 203. With reference to FIGS. 6 and 7, receptacle 201 has an insulative housing 205 made from, for example, a suitable plastic. Housing 205 can have a generally planar base 207 with a wall 209 extending around the perimeter.

Apertures 211 extend through housing 205 from a mating end 213 that faces plug 203 to a mounting end 215 that faces a substrate (not shown) to which receptacle 201 attaches. Contacts 217, 219 reside within apertures 211, preferably by an interference fit. Contacts 217, 219 form an array of rows (aligned with arrow R) and columns (aligned with arrow C) on housing 205.

As with the first alternative embodiment, receptacle 203 preferably surface mounts to the substrate using, for example, ball grid array (BGA) technology.

Contact 217 preferably carries a signal, while contacts 219 carry ground or power. This embodiment has six contacts 219 shielding contact 217. Four of contacts 219 are arranged as described above with respect to the first alternative embodiment. The two additional contacts 219 reside in rows adjacent contacts 217 as shown in FIGS. 6 and 7. In other words, two of the six contacts 219 reside in the same row as contact 217, while the other four of the six contacts 219 reside in adjacent rows.

Contacts 219 that reside in the same row as contact 217 have generally the same orientation as contact 217. Contacts 219 that reside in adjacent rows are angled relative to contact 217. Preferably, contacts 219 that reside in adjacent columns are generally perpendicular to contact 217.

Each contact 217, 219 has major surfaces defining sides 223 and minor surfaces defining edges 225. As shown in FIGS. 6 and 7, an edge 225 of each contact 219 is adjacent contact 217. Placing edge 225 of contact 219 nearest contact 217 more strongly couples contacts 217, 219 than when side 223 of contact 219 is placed adjacent contact 217.

Figure 8:
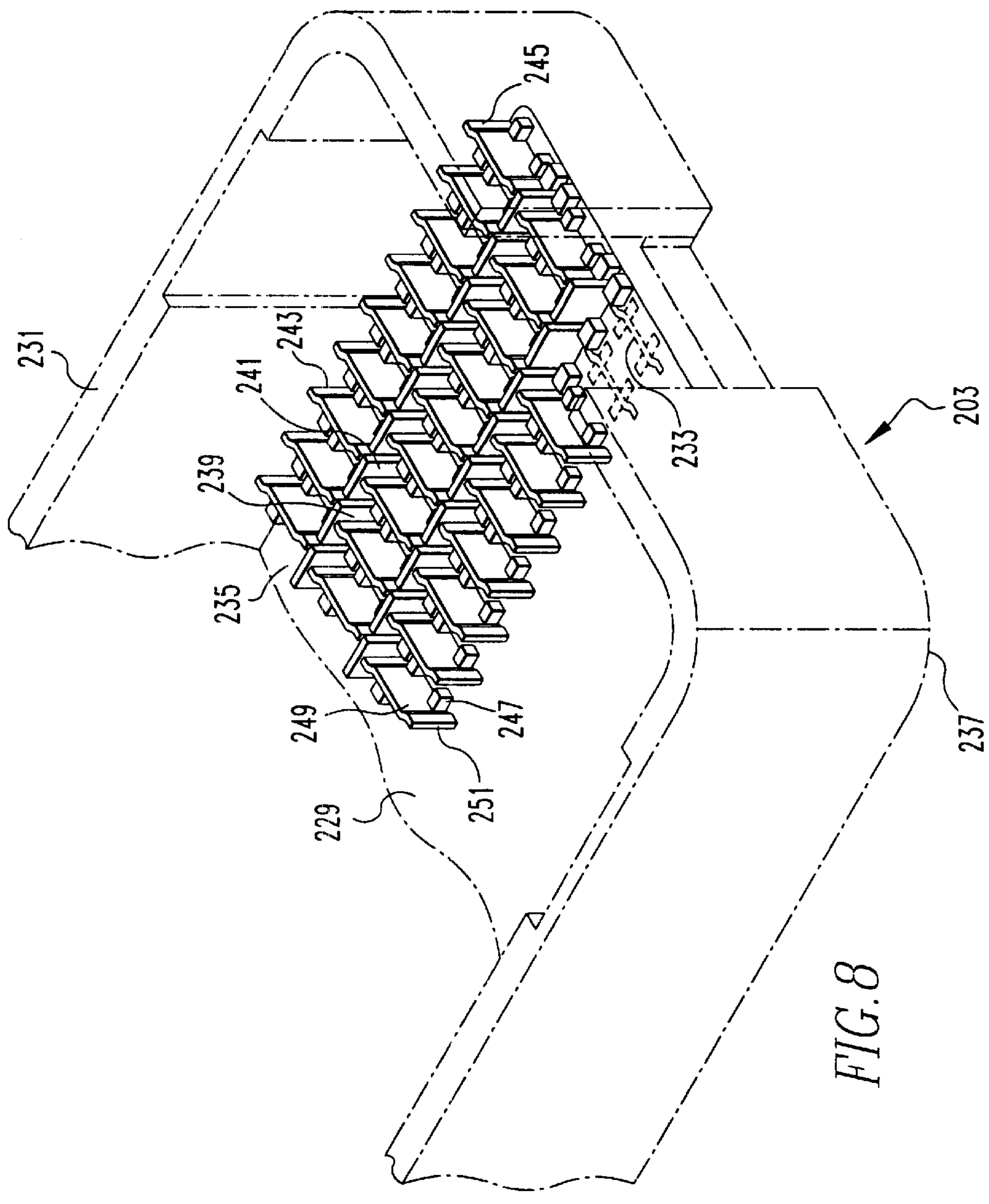
FIG. 8 is a perspective view of another component of the second alternative embodiment of the present invention.
Figure 9:
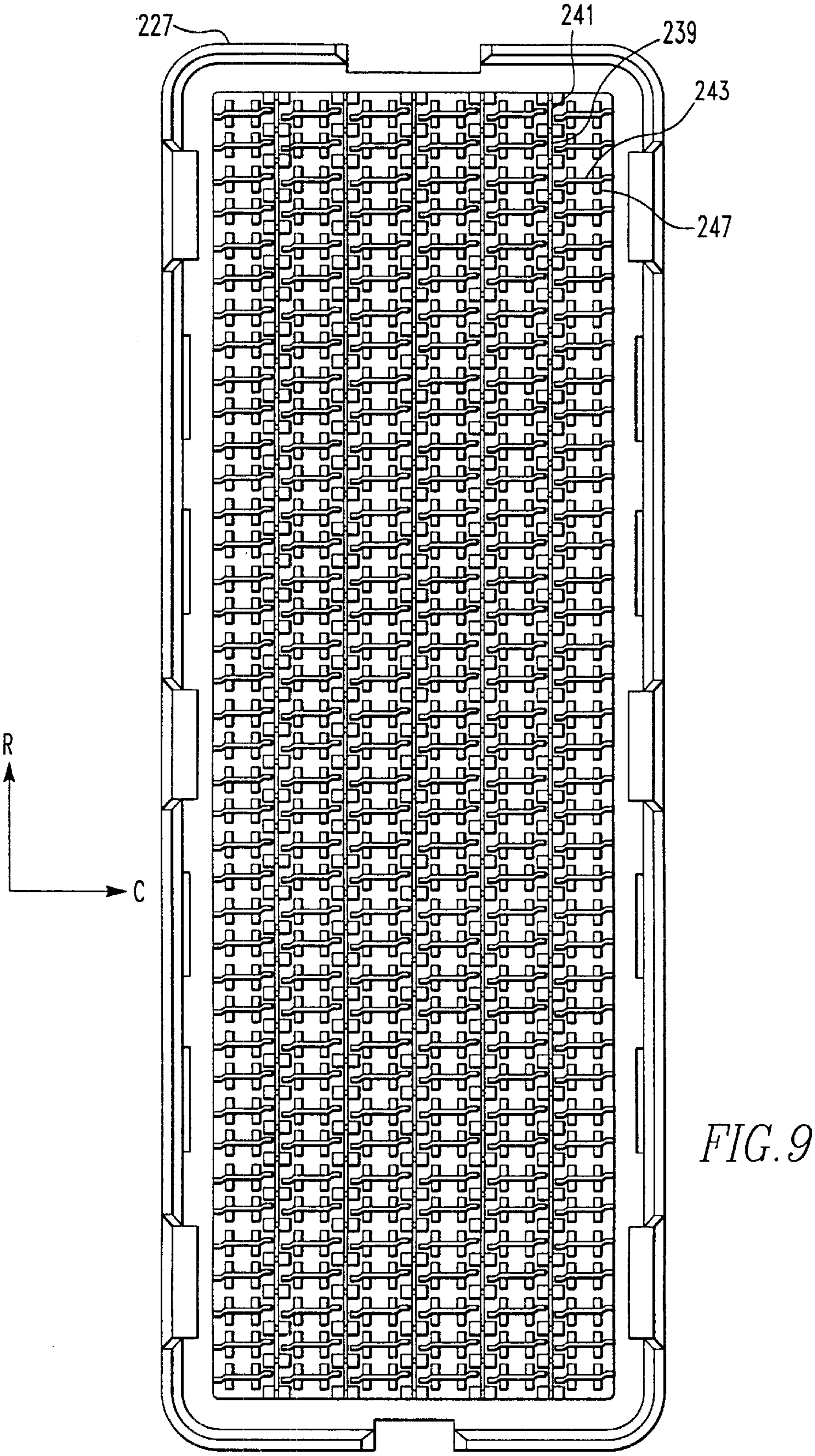
FIG. 9 is a top view of the component shown in FIG. 8.

With reference to FIGS. 8 and 9, plug 203 has an insulative housing 227 made from, for example, a suitable plastic. Housing 227 can have a generally planar base 229 with a wall 231 extending around the perimeter.

Apertures 233 extend through housing 227 from a mating end 235 that faces receptacle 201 to a mounting end 237 that faces a substrate (not shown) to which plug 203 attaches. Contacts 239, 241, 243 reside within apertures 233, preferably by an interference fit. Contacts 239, 241, 243 form an array of rows (aligned with arrow R) and columns (aligned with arrow C) on housing 227.

Due to the close proximity of contacts 243 to contacts 239, 241, contacts 243 can have bent portions 245. Bent portions 245 allow the beams of contacts 217, 219 engage contacts 239, 241 without interference.

A series of projections 247 can extend from mating end 235 of housing 227. Projections 247, preferably formed during the injection molding step that forms housing 227, can abut sides 223 of contacts 239, 241, 243 and could also be placed between contacts 239, 243. Projections 247 can help control the coupling between contacts 239 and contacts 241, 243, and can laterally support contacts 239, 241, 243 to improve rigidity.

As with receptacle 201, plug 203 can surface mount to the substrate using, for example, BGA technology.

Contact 239 preferably carries a signal, while contacts 241, 243 carry ground or power. As discussed earlier with respect to contacts 217, 219 of receptacle 201, six contacts 241, 243 surround each contact 239 as shown in FIGS. 8 and 9. Contacts 241 reside in the same column as contact 239, while contacts 243 reside in adjacent columns.

Contacts 241 have generally the same orientation as contact 239 since they reside in the same row. Contacts 243, however, are angled relative to contacts 239. Preferably, contacts 243 are generally perpendicular to contacts 239.

Each contact 239, 241, 243 has major surfaces defining sides 249 and minor surfaces defining edges 251. As shown in FIGS. 8 and 9, an edge 251 of each contact 241, 243 is adjacent contact 239 or adjacent another contact 241. Placing edges 251 of contacts 241, 243 nearest contact 239 more strongly couples contacts 239 with contacts 241, 243 than when sides 249 of contacts 241, 243 are placed adjacent contact 239.

Figure 16B:
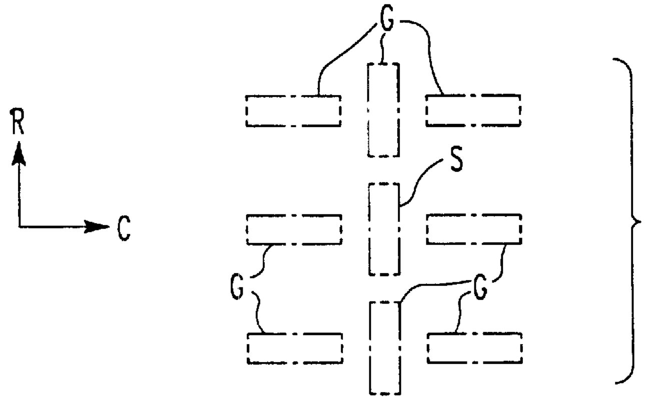

FIG. 16*b* schematically demonstrates the contact arrangement in the second alternative embodiment of the present invention. As discussed above, six ground or power contacts G surround each signal contact S. When compared to the arrangement of the first alternative embodiment shown in FIG. 16*a*, the second alternative embodiment places additional ground or power contacts G in the rows adjacent signal contacts S.

Most ground or power contacts G provide shielding to more than one signal contact S. However, since the second alternative embodiment uses additional ground or power contacts G than the first alternative embodiment, the signal-to-ground ratio is lower than the first alternative embodiment. As an example, an 11×15 array connector with a total pin count of 165 could have 35 signal contacts and 130 ground or power contacts. As will be discussed in more detail below, the lower signal-to-ground ratio allows the connector to operate at higher speeds.

The third alternative embodiment of the present invention will now be described with reference to FIGS. 10–13 and 16*c*. Features common to the other alternative embodiments will use the same reference character, save a change in the hundred digit.

Figure 10:
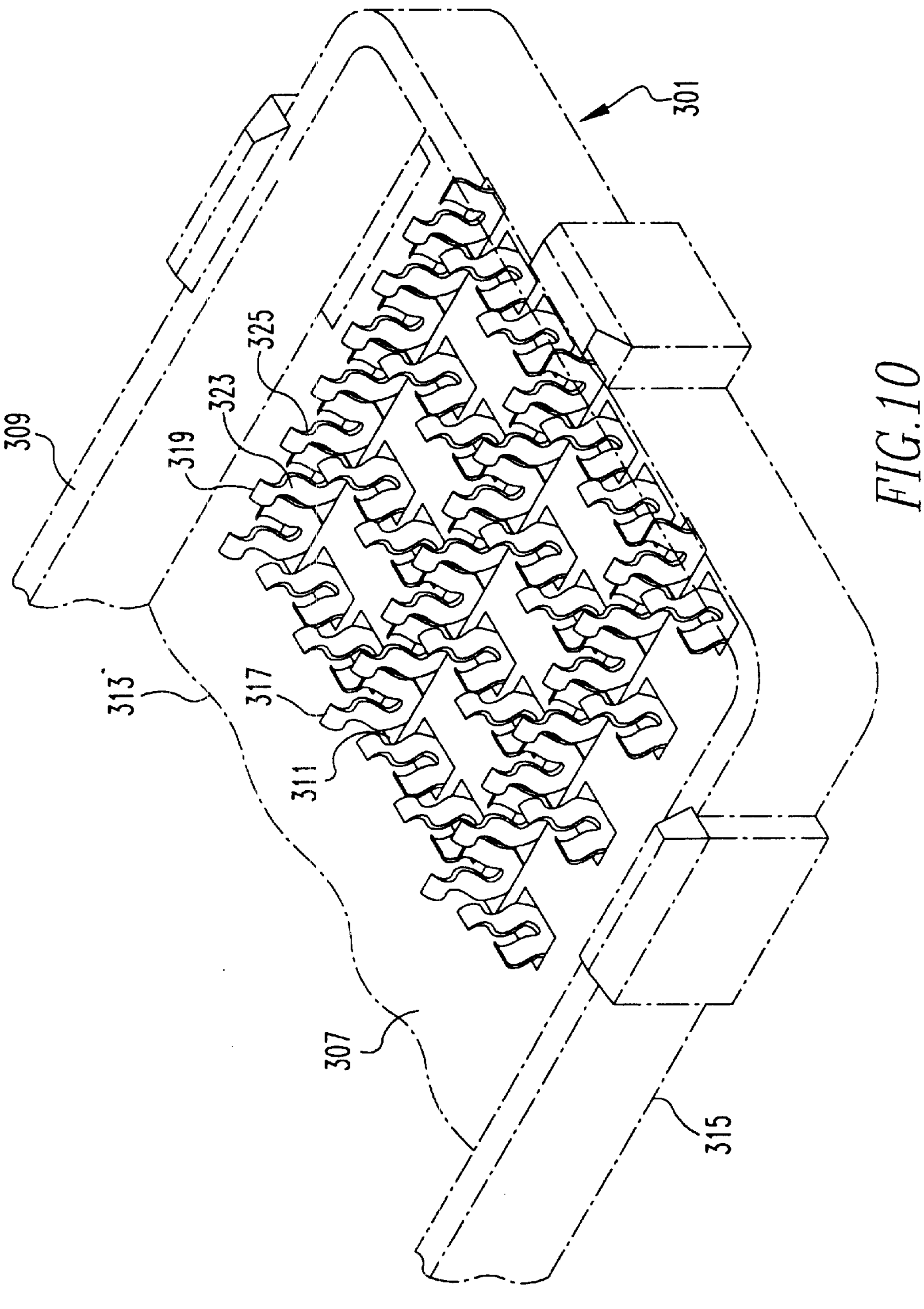
FIG. 10 is a perspective view of one component of a third alternative embodiment of the present invention.
Figure 11:
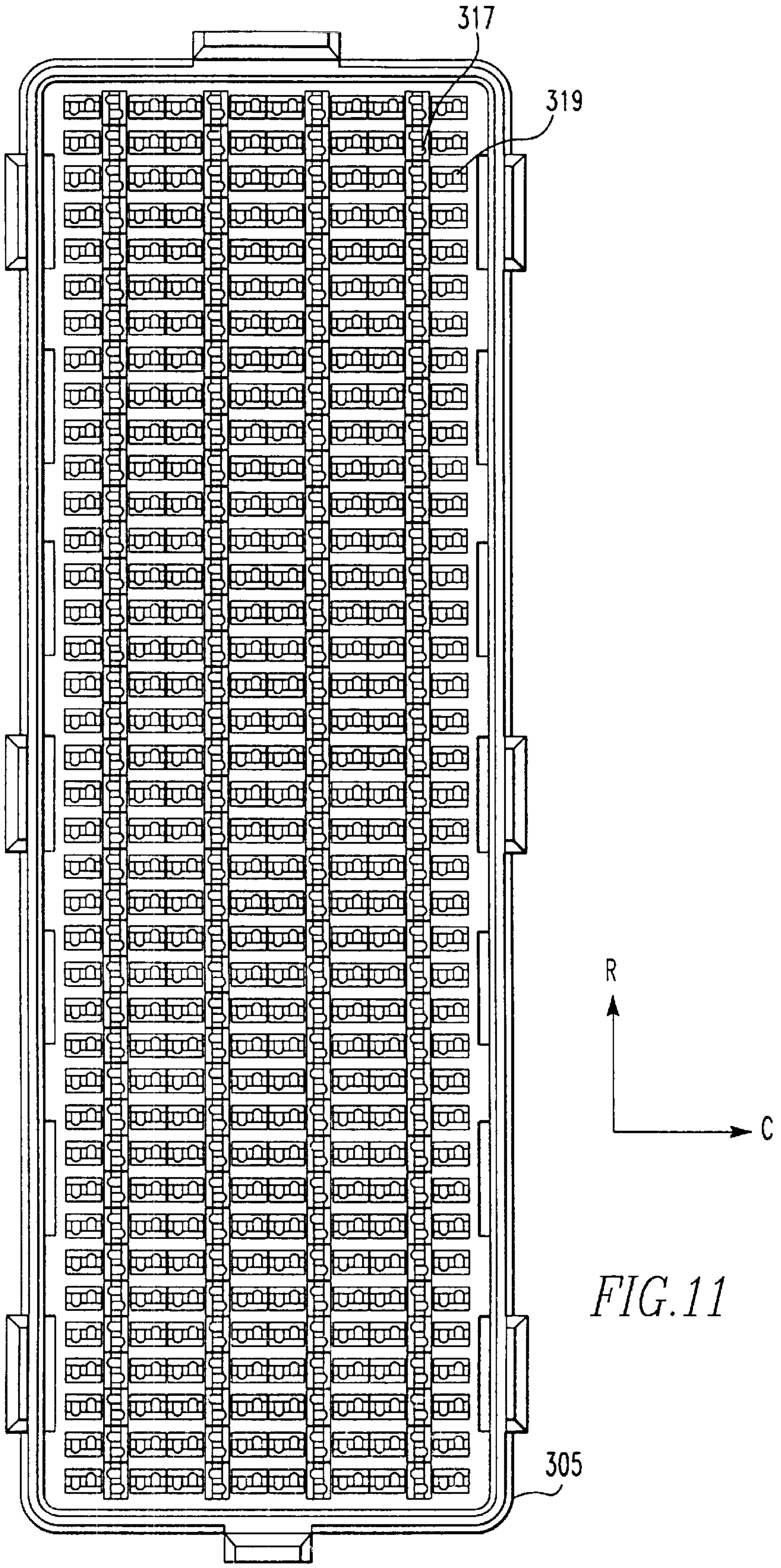
FIG. 11 is a top view of the component shown in FIG. 10.

The connector includes a receptacle 301 and a plug 303. With reference to FIGS. 10 and 11, receptacle 301 has an insulative housing 305 made from, for example, a suitable plastic. Housing 305 can have a generally planar base 307 with a wall 309 extending around the perimeter.

Apertures 311 extend through housing 305 from a mating end 313 that faces plug 303 to a mounting end 315 that faces a substrate (not shown) to which receptacle 301 attaches. Contacts 317, 319 reside within apertures 311, preferably by an interference fit. Contacts 317, 319 form an array of rows (aligned with arrow R) and columns (aligned with arrow C) on housing 205.

As with the other alternative embodiments, receptacle 303 preferably surface mounts to the substrate using, for example, ball grid array (BGA) technology.

Contact 317 preferably carries a signal, while contacts 319 carry ground or power. As with the other embodiments, contacts 319 surround contact 317 for shielding. Some of contacts 319 reside in the same row as contact 317, while other contacts 319 reside in adjacent rows.

Contacts 319 that reside in the same row as contact 317 have generally the same orientation as contact 317. However, contacts 319 that reside in adjacent rows are angled relative to contact 317. Preferably, contacts 319 that reside in adjacent rows are generally perpendicular to contact 317.

Each contact 317, 319 has major surfaces defining sides 323 and minor surfaces defining edges 225. As shown in FIGS. 10 and 11, an edge 325 of each contact 319 that surrounds contact 317 is adjacent contact 317. Placing edge 325 of contact 319 nearest contact 317 more strongly couples contacts 317, 319 than when side 323 of contact 319 is placed adjacent contact 317.

Figure 12:
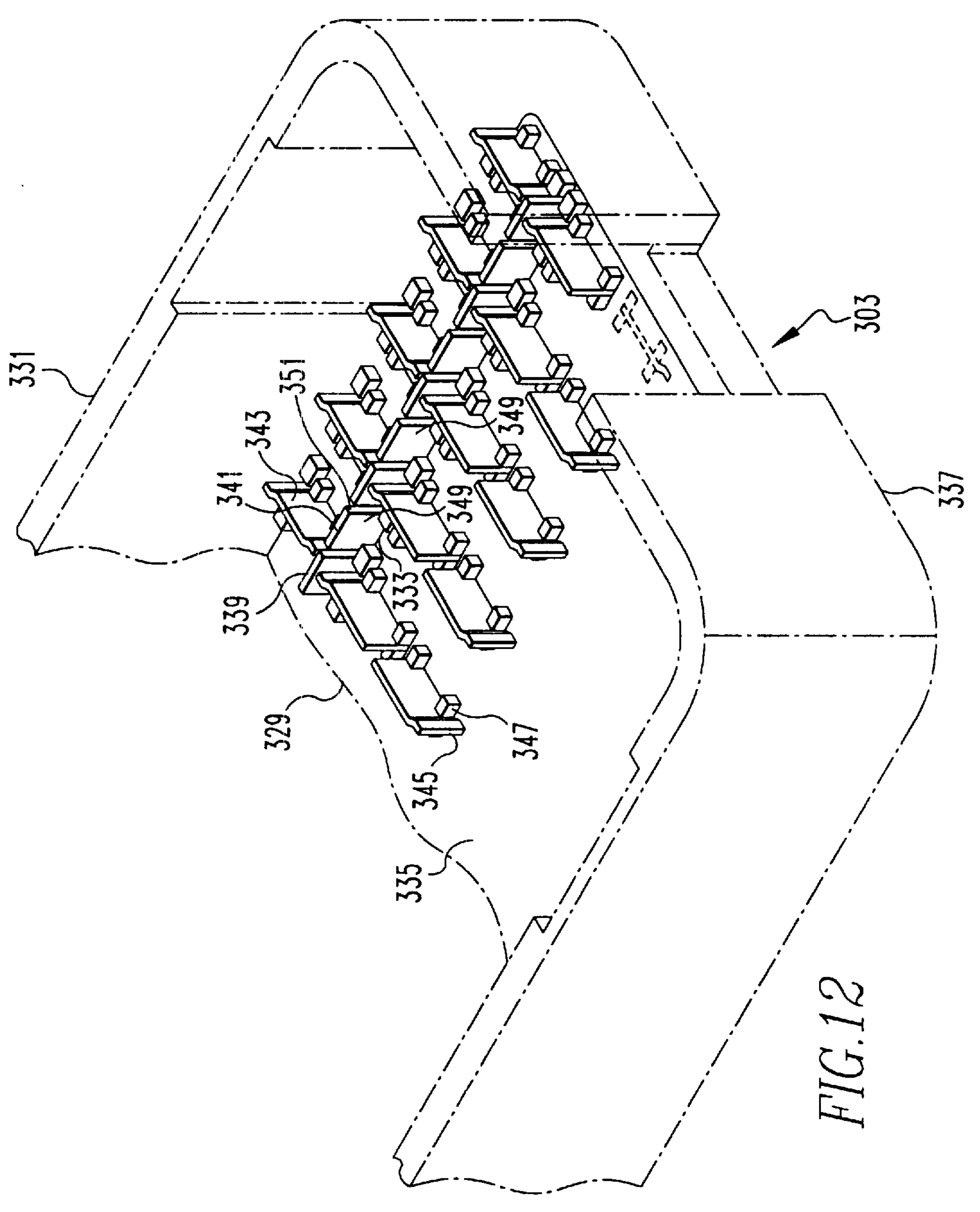
FIG. 12 is a perspective view of another component of the third alternative embodiment of the present invention.
Figure 13:
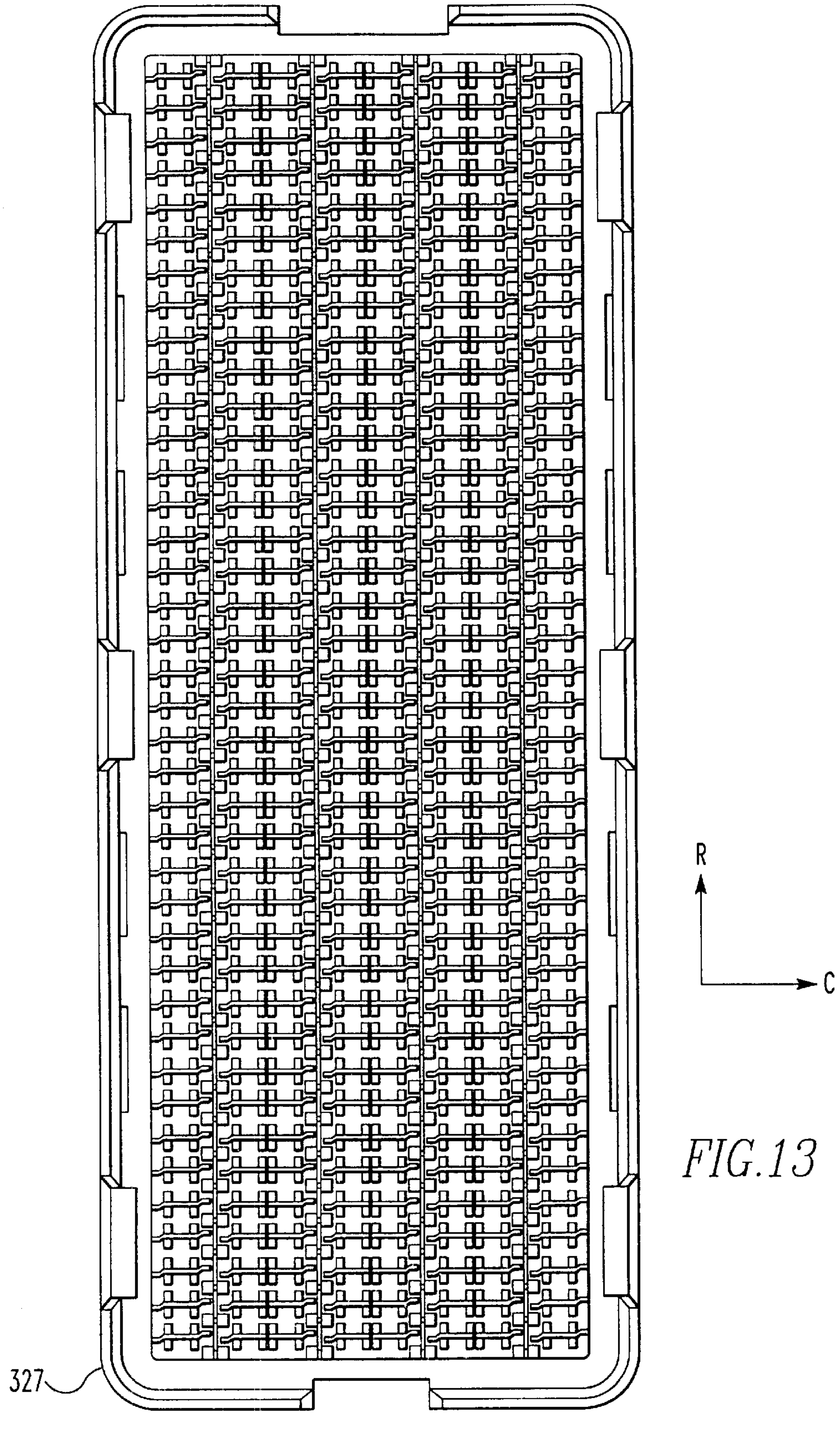
FIG. 13 is a top view of the component shown in FIG. 12.

With reference to FIGS. 12 and 13, plug 303 has an insulative housing 327 made from, for example, a suitable plastic. Housing 327 can have a generally planar base 329 with a wall 331 extending around the perimeter.

Apertures 333 extend through housing 327 from a mating end 335 that faces receptacle 301 to a mounting end 337 that faces a substrate (not shown) to which plug 303 attaches. Contacts 339, 341, 343 reside within apertures 333, preferably by an interference fit. Contacts 339, 341, 343 form an array of rows (aligned with arrow R) and columns (aligned with arrow C) on housing 327.

Due to the close proximity of contacts 343 to contacts 339, 341, the end of contact 343 that faces contacts 339, 341 can have a bent portion 345. Bent portions 345 allow the beams of contacts 317, 319 to engage contacts 339, 341 without interference.

A series of projections 347 can extend from mating end 335 of housing 327. Projections 347, preferably formed during the injection molding step that forms housing 327, can abut sides 323 of contacts 339, 341, 343 and can be placed between contacts 339, 343. Projections 347 can help control the coupling between contacts 339 and contacts 341, 343, and can laterally support contacts 339, 341, 343 to improve rigidity.

As with receptacle 301, plug 303 can surface mount to the substrate using, for example, BGA technology.

Contact 339 preferably carries a signal, while contacts 341, 343 carry ground or power. As discussed earlier with respect to contacts 317, 319 of receptacle 301, contacts 341, 343 surround each contact 339 as shown in FIGS. 12 and 13. Contacts 341 reside in the same row as contact 339, while contacts 343 reside in adjacent rows.

Contacts 341 have generally the same orientation as contact 339 since they reside in the same row. However, contacts 343 are angled relative to contact 339. Preferably, contacts 343 are generally perpendicular to contact 339.

Each contact 339, 341, 343 has major surfaces defining sides 249 and minor surfaces defining edges 251. As shown in FIGS. 12 and 13, an edge 351 of each contact 341, 343 is adjacent contact 339 or adjacent another contact 341. Placing edges 351 of contacts 341, 343 nearest contact 339 more strongly couples contacts 339 with contacts 341, 343 than when sides 349 of contacts 341, 343 are placed adjacent contact 339.

Figure 16C:
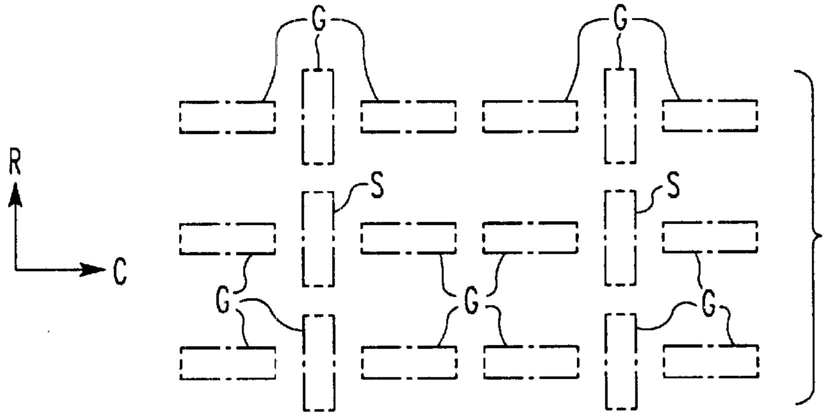

FIG. 16*c* schematically demonstrates the contact arrangement in the third alternative embodiment of the present invention. As discussed above, ground or power contacts G surround each signal contact S. When compared to the arrangement of the second alternative embodiment shown in FIG. 16*b*, the third alternative embodiment places an additional row of ground or power contacts G between rows containing signal contacts S.

Since only some ground or power contacts G provide shielding to more than one signal contact S, the signal-to-ground ratio is lower than the first or second alternative embodiment. As an example, a 12×17 array connector with a total pin count of 204 could have 32 signal contacts and 172 ground or power contacts. As will be discussed in more detail below, the lower signal-to-ground ratio allows the connector to operate at higher speeds than the earlier alternative embodiments.

Figure 14:
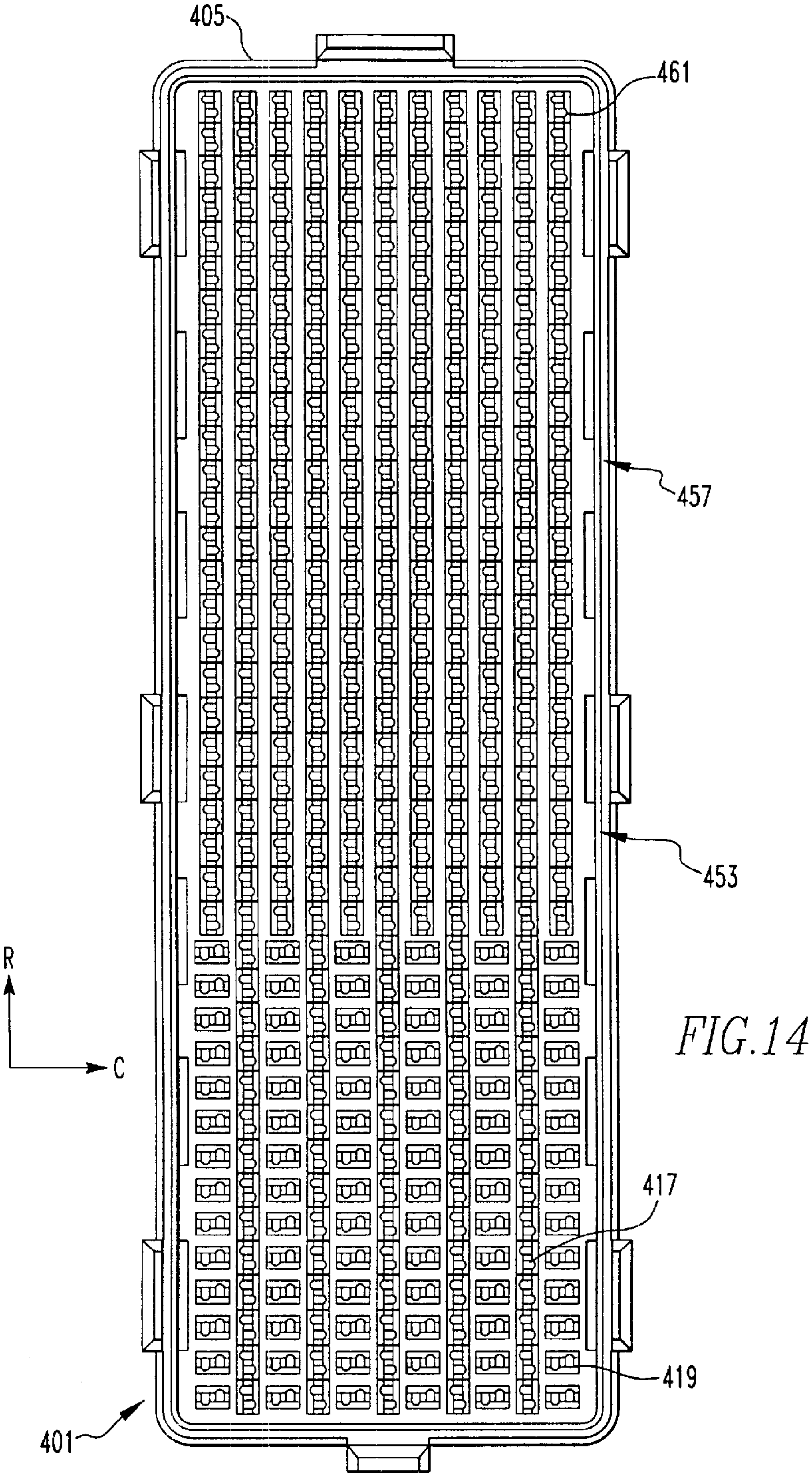
FIG. 14 is a top view of one component of a fourth alternative embodiment of the present invention.
Figure 15:
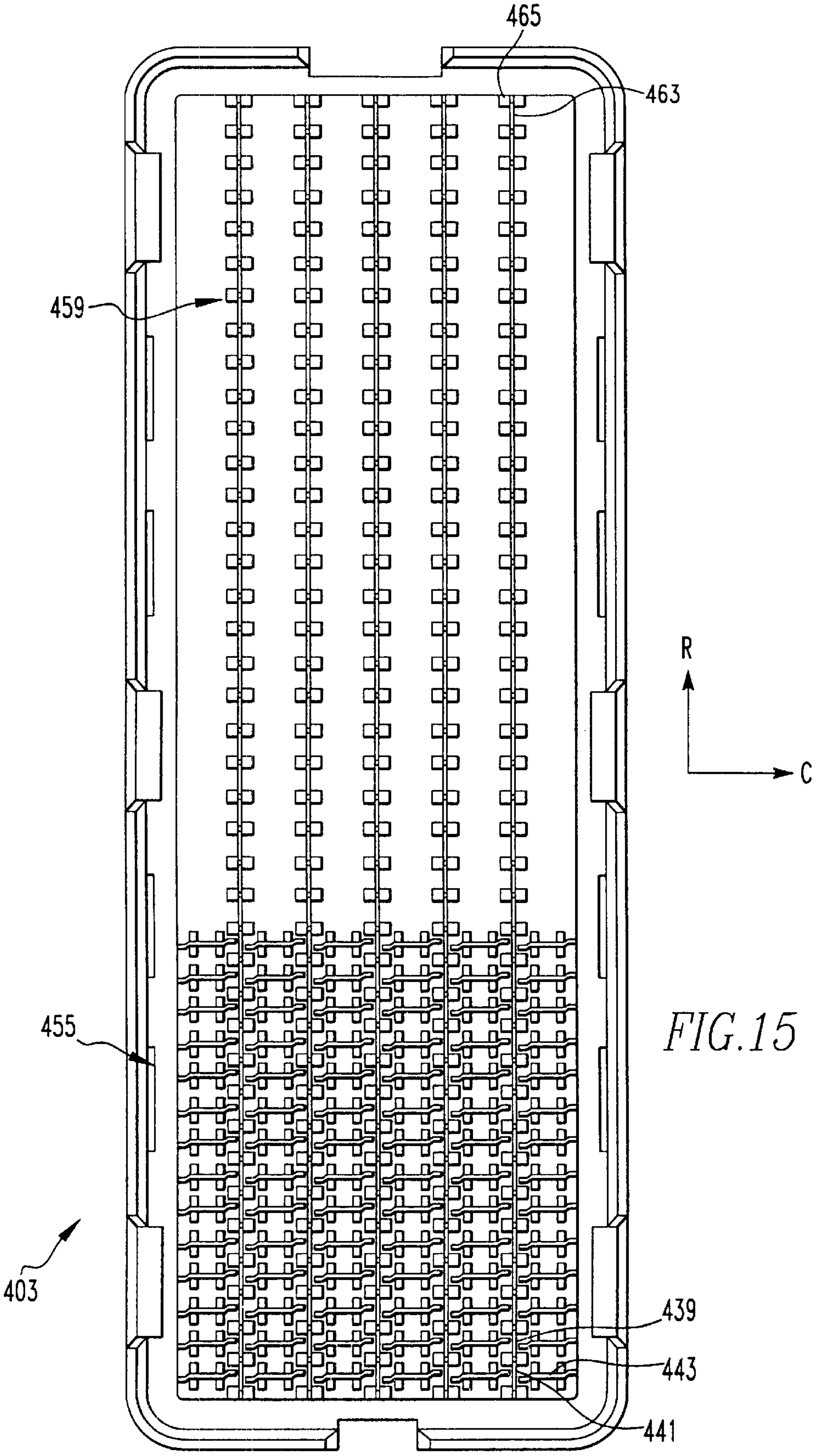
FIG. 15 is a top view of another component of the fourth alternative embodiment of the present invention.

The fourth alternative embodiment of the present invention will now be described with reference to FIGS. 14, 15 and 16*b*. Features common to the other alternative embodiments will use the same reference character, save a change in the hundred digit.

The connector is a hybrid, with both plug 401 and receptacle 403 having high speed sections 453, 455 and low speed sections 457, 459, respectively. High speed sections 453, 455 can have any of the earlier described alternative arrangements of ground and signal contacts. As specifically shown in FIGS. 14 and 15, high speed sections 453, 455 follow the arrangement from the second alternative embodiment. No further discussion of high speed sections 453, 455 is needed.

Low speed section 457 of receptacle 401 has an array of contacts 461 extending through housing 405. Contacts 461 can have any arrangement, but FIG. 14 displays all contacts 461 having the same orientation.

Similar to receptacle 401, low speed section 459 of plug 403 has an array of contacts 463. Contacts 463 can have any arrangement, but FIG. 15 displays all contacts 461 having the same orientation. As with high speed section 455, low speed section 459 may include projections 447 that extend from mating end 435 of housing 427. Projections 247 can help control the coupling between contacts and can laterally support the contacts to improve rigidity.

The present invention can selectively tune the connector to achieve a desired characteristic impedance in several ways. One manner of achieving a desired characteristic impedance in a connector of the present invention adjusts the distance between the ground contacts and the signal contacts. Generally speaking, the closer a ground contact approaches a signal contact, the lower the characteristic impedance. By selecting a distance between signal and ground contacts, the present invention provides a tunable connector. Numerical methods can determine the distance required to achieve a specific characteristic impedance value.

Another manner of achieving a desired characteristic impedance in a connector of the present invention changes the geometric attributes of the ground or signal contacts while maintaining a common pitch. Preferably, the width of the ground contacts are adjusted to achieve the desired characteristic impedance. Adjusting the width of the ground contact changes the size of the edge that faces the signal contact. A larger edge more strongly couples with the signal contact. By selecting an aspect ratio (e.g. by adjusting width), the present invention provides a tunable connector. As discussed above, numerical methods can determine the aspect ratio required to achieve a specific characteristic impedance value.

A third manner of achieving a desired characteristic impedance is the placing of a dielectric material between the signal and ground contacts. The dielectric constant of the material placed between a ground and a signal contact determines the characteristic impedance of the connector. Selecting a specific material, including air, to reside between a signal and ground contact provides a tunable connector. As discussed above, numerical methods can determine the type, size and placement of the dielectric material relative to the ground and signal contacts required to achieve a specific characteristic impedance value for the connector.

FIGS. 17*a–c*, 18*a–c* and 19*a–c* demonstrate the estimated advantages of the several alternative embodiments of the present invention.

PROPHETIC EXAMPLE 1

A theoretical electrical connector was created using IFS CONNECT, a boundary element field solver available from Interactive Products Corporation, and the Simulation Program with Integrated Circuit Emphasis (SPICE) simulation program available in the public domain. The connector in this first example resembles the alternative embodiment of the present invention shown in FIGS. 1–4, 5*a*, 5*b* and 16*a*.

Figure 17A:
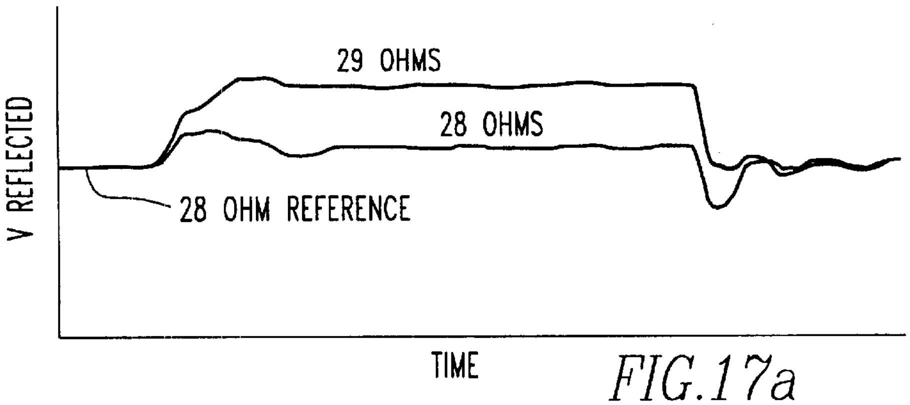
FIGS. 17*a–c* demonstrate the estimated characteristic impedance at a central location and at an outer region of the first alternative embodiment of the present invention; the second and a portion of the fourth alternative embodiment of the present invention; and the third alternative embodiment of the present invention, respectively.
Figure 18A:
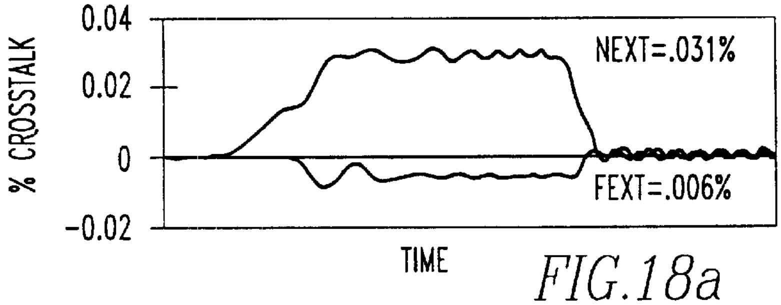
FIGS. 18*a–c* demonstrate the estimated near end cross-talk (NEXT) and far end cross-talk (FEXT) between contacts in a row of the first alternative embodiment of the present invention; the second and a portion of the fourth alternative embodiment of the present invention; and the third alternative embodiment of the present invention, respectively.
Figure 19A:
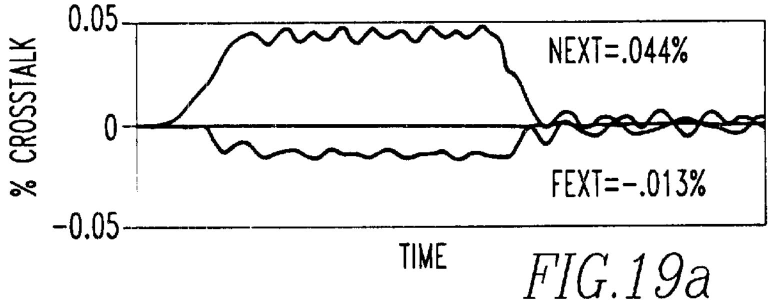
FIGS. 19*a–c* demonstrate the estimated near end cross-talk (NEXT) and far end cross-talk (FEXT) between contacts in a column of the first alternative embodiment of the present invention; the second and a portion of the fourth alternative embodiment of the present invention; and the third alternative embodiment of the present invention, respectively.

Then, the characteristic impedance of the theoretical connector was estimated by exciting the connector model with a simulated Time Delay Reflectometer (TDR) circuit. FIG. 17*a* displays the estimated characteristic impedance at two locations on the theoretical connector. The first location, associated with the lower impedance value, resides at a central location on the connector. The second location, associated with the higher impedance value, resides along an outer region of the connector.

Figure 17B:
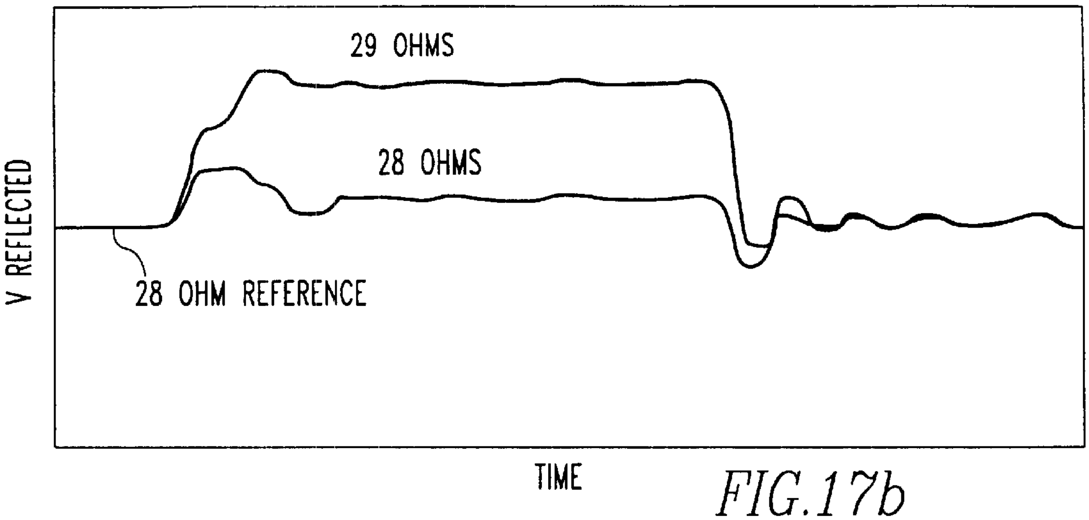
Figure 17C:
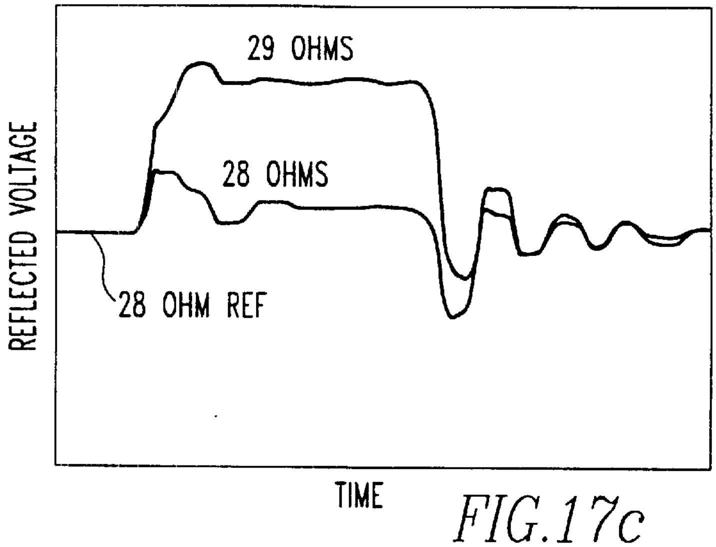

The IFS CONNECT and the SPICE simulation programs then estimated the cross-talk characteristics of the simulated connector. FIG. 17*b* displays the cross-talk performance between contacts residing in the same row. FIG. 17*c* displays the cross-talk performance between contacts residing in the same column.

PROPHETIC EXAMPLE 2

Figure 18B:
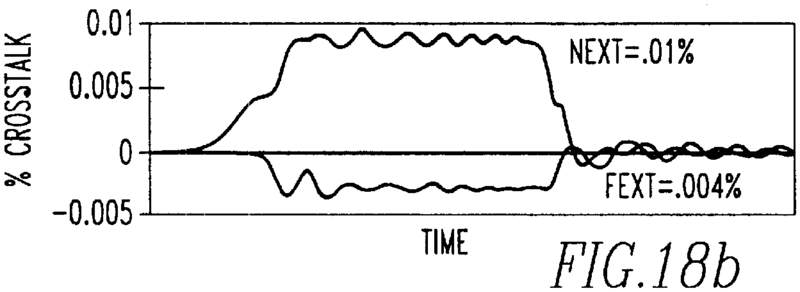
Figure 19B:
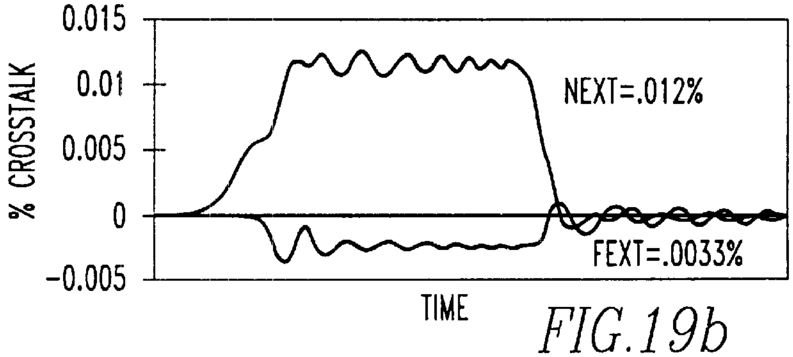

The same tests were performed on a theoretical electrical connector resembling the alternative embodiment of the present invention shown in FIGS. 6–9 and 16*b*. FIG. 17*b* displays the estimated characteristic impedances of the simulated connector. The characteristic impedance values are generally the same as the first alternative embodiment. FIGS. 18*b* and 19*b* display the cross-talk performance of the simulated connector. This embodiment displays improved cross-talk performance over the first alternative embodiment.

PROPHETIC EXAMPLE 3

Figure 18C:
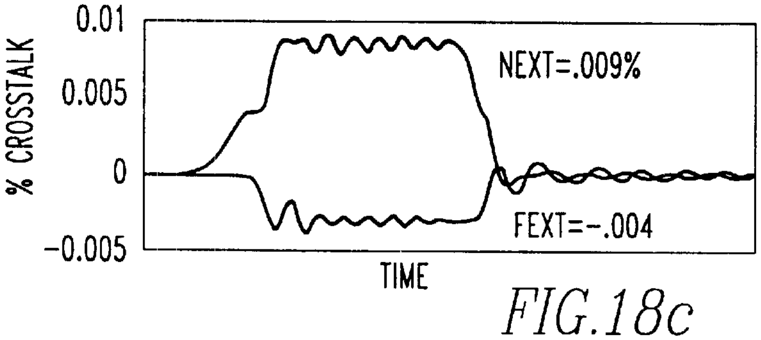
Figure 19C:
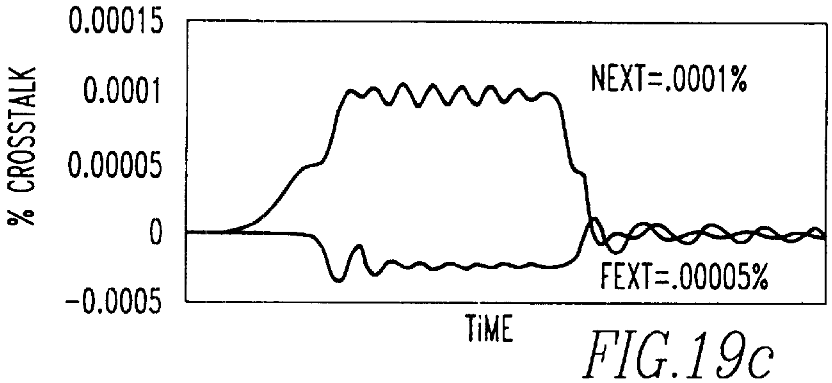

The same tests were performed on a theoretical electrical connector resembling the alternative embodiment of the present invention shown in FIGS. 10, 11 and 16*c*. FIG. 17*c* displays the estimated characteristic impedances of the simulated connector. The characteristic impedance values are generally the same as the first and second alternative embodiments. FIGS. 18*c* and 19*c* display the cross-talk performance of the simulated connector. This embodiment displays improved cross-talk performance over the first and second alternative embodiments.

While the present invention has been described in connection with the preferred embodiments of the various figures, it is to be understood that other similar embodiments may be used or modifications and additions may be made to the described embodiment for performing the same function of the present invention without deviating therefrom. Therefore, the present invention should not be limited to any single embodiment, but rather construed in breadth and scope in accordance with the recitation of the appended claims.

What is claimed is:

1. An electrical connector comprising:

an insulative housing;

a plurality of first contacts arranged in a column within the housing, the first contacts including lateral edges and lateral surfaces and defining a first dominant plane within which the first contacts generally reside; and a plurality of second contacts arranged in a row within the housing, the second contacts including lateral edges and surfaces and defining a second dominant plane within which the second contacts generally reside and the second dominant plane being angled relative to the first dominant plane;

wherein the first contacts and the second contacts are positioned such that one of the first contacts is disposed at each intersection of the column of first contacts and the row of second contacts; and further wherein the electrical connector exhibits a characteristic impedance of less than approximately 50 ohms.

2. The electrical connector as recited in claim 1, wherein the characteristic impedance is less than approximately 45 ohms.

3. The electrical connector as recited in claim 1, wherein the characteristic impedance is between approximately 25 ohms and approximately 30 ohms.

4. The electrical connector of claim 1 wherein the first contact are alternating signal contacts and one of ground and power contacts and the second contacts are one of ground and power contacts.

5. The electrical connector of claim 1, wherein each of the plurality of second contacts is located a predetermined distance away from each of the plurality of first contacts, the predetermined distance reflective of the desired impedance.

6. The electrical connector of claim 1 wherein the second contacts have a predetermined aspect ratio, the aspect ratio reflective of the characteristic impedance.

7. The electrical connector of claim 1, further comprising a material between the first contacts and the second contacts, the material having a dielectric constant providing the desired characteristic impedance.

8. The electrical connector of claim 1 wherein the second dominant plane is perpendicular to the first dominant plane.

9. The electrical connector of claim 1 wherein the connector has a characteristic impedance of 50 ohms or less.

10. The electrical connector of claim 4, wherein signal contacts and the ground or power contacts extend between a mating side and a mounting side of the connector, the signal connector and the ground or power contacts having a pitch on the mating side generally equal to a pitch on the mounting side.

11. The electrical connector of claim 10, wherein the pitch is approximately 0.050".

12. The electrical connector of claim 1, further comprising fusible elements secured to the first contacts and to the second contacts for surface mounting the connector to a substrate.

13. The electrical connector of claim 12, wherein the fusible elements are solder balls.

14. The electrical connector of claim 1, wherein the each of the plurality of second contacts have an edge positioned adjacent to one of the first contacts.

15. The electrical connector of claim 14, wherein the edge has a width, the width reflective of the desired characteristic impedance.

16. An electrical connector comprising:

an insulative housing;

a plurality of signal contacts within the housing, each signal contact including lateral edges and lateral sides; and a plurality of one of ground and power contacts within the housing, each of the plurality of one of ground and power contacts including opposing lateral edges and lateral sides;

wherein the signal contacts and one of the ground and power contacts are arranged in an array of rows and columns such that the column contains an alternating arrangement of signal contacts and one of ground contacts and power contacts and the row contains one of power contacts and ground contacts such that at least one lateral edge of one of the ground and power contacts in the row is disposed substantially adjacent to a midpoint between the lateral edges of one of the alternating signal contact and one of the ground and power contacts in the column.

17. The electrical connector as recited in claim 16, wherein at least four ground or power contacts surround each signal contact.

18. The electrical connector of claim 16 wherein the connector has a characteristic impedance of 50 ohms or less.

19. The electrical connector as recited in claim 16, further comprising fusible elements secured to the signal contacts and to the ground or power contacts for surface mounting the connector to a substrate.

20. The electrical connector as recited in claim 19, wherein the fusible element is a solder ball.

21. The electrical connector as recited in claim 16, wherein the signal contacts and the power or ground contacts are positioned in an array of rows and columns.

22. The electrical connector as recited in claim 21, wherein the rows contain the signal contact and power or ground contact arranged in an alternating fashion.

23. The electrical connector as recited in claim 21, wherein the signal contacts reside in alternating rows.

24. The electrical connector as recited in claim 21, wherein the signal contacts reside in every third row.

25. A method of making an electrical connector, comprising the steps of:

providing an insulative housing;

providing a plurality of signal contacts each having lateral edges and lateral sides;

providing a plurality of one of ground and power contacts each having lateral edges and lateral sides;

inserting the signal contacts into the insulative housing; and inserting the plurality of one of ground and power contacts into the housing such that at least one of the lateral edge of each of the plurality of one of ground and power contacts is disposed substantially adjacent to the midpoint between the lateral edges of one of the signal contacts;

whereby the electrical connector exhibits a desired characteristic impedance.

26. The method of claim 25 wherein inserting the ground or power contact comprises inserting the ground or power contact into the insulative housing at a predetermined distance away from the signal contacts, whereby the predetermined distance is reflective of the desired characteristic impedance.

27. The method of claim 25 wherein providing the ground or power contact comprises providing a ground or power contact having lateral edges having a width, whereby the width of the lateral edge is reflective of the characteristic impedance.

28. The method of claim 25 further comprising:

placing a material the ground or power contacts and the signal contact, whereby the material is reflective of the desired characteristic impedance.

29. The method of claim 25 wherein inserting the power or ground contact comprises inserting the power or ground contact into the insulative housing at an angle relative to the signal contacts.

30. The method of claim 29 wherein the angle is approximately 90 degrees.

* * * * *